United States Patent [19]
Lucas

[11] Patent Number: 5,464,090
[45] Date of Patent: Nov. 7, 1995

[54] HANDLING SYSTEMS FOR LAMELLAE

[76] Inventor: Alan W. Lucas, Coombe Farm, Headcorn Road, Sutton Valence, Maidstone, Kent ME17 3AX, Great Britain

[21] Appl. No.: 133,182

[22] PCT Filed: Apr. 21, 1992

[86] PCT No.: PCT/GB92/00722

§ 371 Date: Oct. 28, 1993

§ 102(e) Date: Oct. 28, 1993

[87] PCT Pub. No.: WO92/18402

PCT Pub. Date: Oct. 29, 1992

[30]    Foreign Application Priority Data

Apr. 18, 1991 [GB] United Kingdom .................. 9108366

[51] Int. Cl.$^6$ .................................................. B65G 49/06
[52] U.S. Cl. ................ 198/803.01; 198/409; 198/750.1; 198/803.14; 198/803.11; 414/799
[58] Field of Search .................... 198/347.3, 409, 198/468.1, 465.1, 465.3, 473.1, 484.1, 750, 803.01, 803.2, 803.1, 803.11, 803.13, 803.14, 838, 841, 795, 750.1; 414/417, 799; 271/903

[56]    References Cited

U.S. PATENT DOCUMENTS

| 2,406,000 | 8/1946 | Dawn | 198/803.01 |
| 4,284,188 | 8/1981 | Gram | 198/795 |
| 4,712,963 | 12/1987 | Kondo | 414/222 |
| 4,723,652 | 2/1988 | Rich | 198/803.13 |
| 4,751,998 | 6/1988 | Yano | 198/465.1 |
| 5,064,054 | 11/1991 | Hoppmann et al. | 198/795 |
| 5,226,524 | 7/1993 | Guttinger et al. | 198/803.01 |

FOREIGN PATENT DOCUMENTS 2594810  8/1987  France .

*Primary Examiner*—Joseph E. Valenza
*Attorney, Agent, or Firm*—Price, Heneveld, Cooper, DeWitt & Litton

[57]    ABSTRACT

A system for handling lamellae in a spaced but face-to-face arrangement includes a pair of facing hoop-shaped guide sprockets arranged in tandem array between the guides, and a rack comprising a pair of parallel legs of roller chain supporting a plurality of slats shaped to receive edges of lamellae. The slats have projections at their end which are positioned on end feed platforms and pass along grooves in the guides with the roller chains engaging and being driven by one of the sprockets.

22 Claims, 2 Drawing Sheets

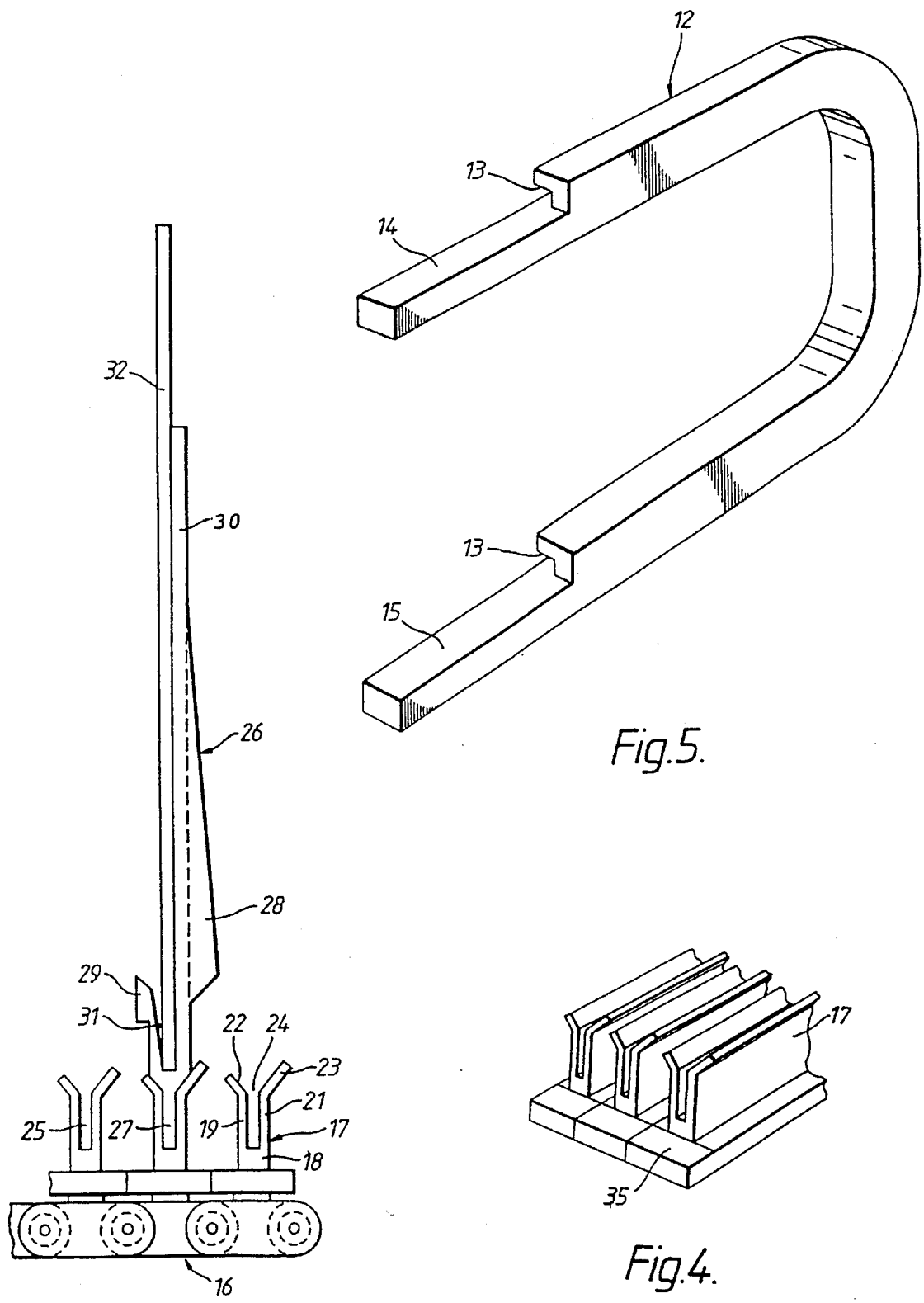

HANDLING SYSTEMS FOR LAMELLAE

BACKGROUND OF THE INVENTION

This invention relates to handling systems for lamellae. While the invention is particularly suitable for use with systems for handling printed circuit board blanks during the production process and before the application of components thereto, the invention may be applied to handling systems for other lamellae in the form of rigid or semi-rigid or flexible sheets, plates, cards or the like; the invention is particularly concerned with systems whereby such lamellae are held at only one edge and on one face to avoid damage to the other broad surfaces of the lamellae or, for example, to fragile or uncured coatings thereon. The invention is particularly applicable to sheets which are fairly limp or flexible but can be applied to rigid lamellae also.

In the production of printed circuit boards, substrates are subjected to various manufacturing processes. In some of these processes the boards themselves have surfaces which can easily be damaged; in other cases, at least one surface of the finished or semi-finished board is provided with a coating; before this coating fully hardens, it can be damaged by contact with another board, with handling means or with anything else. The processes are semi-continuous and the boards may be carried on a conveyor slowly through a processing station. Devices have been produced for accumulating boards from the conveyor and holding them in a compact but non-touching arrangement, for example prior to removal to another operating station or while a coating thereon hardens. In one such accumulator there is a continuous conveyor; the surface of the conveyor is provided by a plurality of parallel slats or profiles which extend across the conveyor and each of which is generally U-shaped in section, the slats being mounted on a pair of chain loops which pass around sprockets at each end of the conveyor. The bottom of each U is attached to the drive chains with the opening of the U extending upwardly when the U is travelling along the upper pass of the conveyor and the U has a flared mouth. At each end of the conveyor, as the drive chains pass around the sprockets, adjacent slats are fanned out and, when halfway round the sprockets, the mouth of the U faces horizontally. As each slat reaches the horizontal position at the receiving end, a printed circuit board has one edge inserted in the slat so that, as the conveyor continues to move, the slat is gradually transferred from a horizontal position to an approximately vertical position and travels in this position along the conveyor towards the opposite end. Printed circuit boards may be fed into the slats by hand or there may be an input conveyor directing boards to the slats. The upper pass of the conveyor may be sufficiently long to enable the machine to accumulate 50 to 100 boards or more. Unless the boards are to be directed to a delivery conveyor (in which case they may be returned to the horizontal at the discharge end of the conveyor), the boards have to be removed one by one by hand and may then be transferred by an operator into storage racks. This handling is time consuming and unless it is done with care damage can be done to the delicate boards. Machines are available having a swinging and translating arm which mechanically removes boards one by one from a conveyor to a stack but this is expensive and does not avoid the problem of damage to the boards by contact with other boards.

SUMMARY OF THE INVENTION

According to one aspect of the present invention, a system for handling lamellae to be arranged generally vertically in a parallel array includes, a rack. The rack has a support structure which is rigid about lines extending in one direction and is flexible about parallel lines extending in a second direction perpendicular to the first. A support for supporting at least the lower edges of the lamellae extends upwardly from the support. The rack moves along a non-linear path extending generally in the second direction.

The rack or unit may carry chain links so that it may cooperate with a sprocket which may, as desired, provide support, drive and guidance; the unit may be caused to change direction around the sprocket to provide the non-linear path.

The handling system may include a pair of parallel guides with which the rack or unit cooperates to guide the rack or unit along its path. For example, the rack or unit may have lateral projections engaging in grooves in the guides. The rack or unit may include slats for supporting the lamellae and the projections may be constituted by the end of the slats or may be constituted by elements separate from the slats and carried by the chain links.

In one possible arrangement, the system includes one or more stationary guides for the rack and pusher means, such as a pneumatic or hydraulic cylinder, for pushing the rack along the guide or guides.

The rack or unit may carry a plurality of elongate support means, for example fingers, to support lamellae, particularly flexible or flimsy lamellae. Where the unit includes slats, the fingers may be mounted on the slats.

According to a second aspect of the invention, a system for handling lamellae in a spaced but face-to-face arrangement includes a substantially flat rack which is flexible in one direction in the manner of a roller shutter. On one side of the rack lamellae are supported edge-on to the rack, and guided along a path in one part of which the rack is flexed with a curvature greater than in another part of the path. In the other part of the path the rack may be flat.

The invention may be carried into practice in various ways and a handling system for printed circuit boards will now be described by way of example with reference to the accompanying diagrammatic and simplified drawings, in which:

BRIEF DESCRIPTION OF THE DRAWINGS

FIG. 3 is an end elevation of three of the slats or conveyor holders of the system shown in FIGS. 1 and 2 to a larger scale;

FIG. 4 is a perspective view of the ends of adjacent slats; and

FIG. 5 is a diagrammatic perspective view of one of the guides for the ends of the slats.

BRIEF DESCRIPTION OF THE PREFERRED EMBODIMENTS

Figure 1:
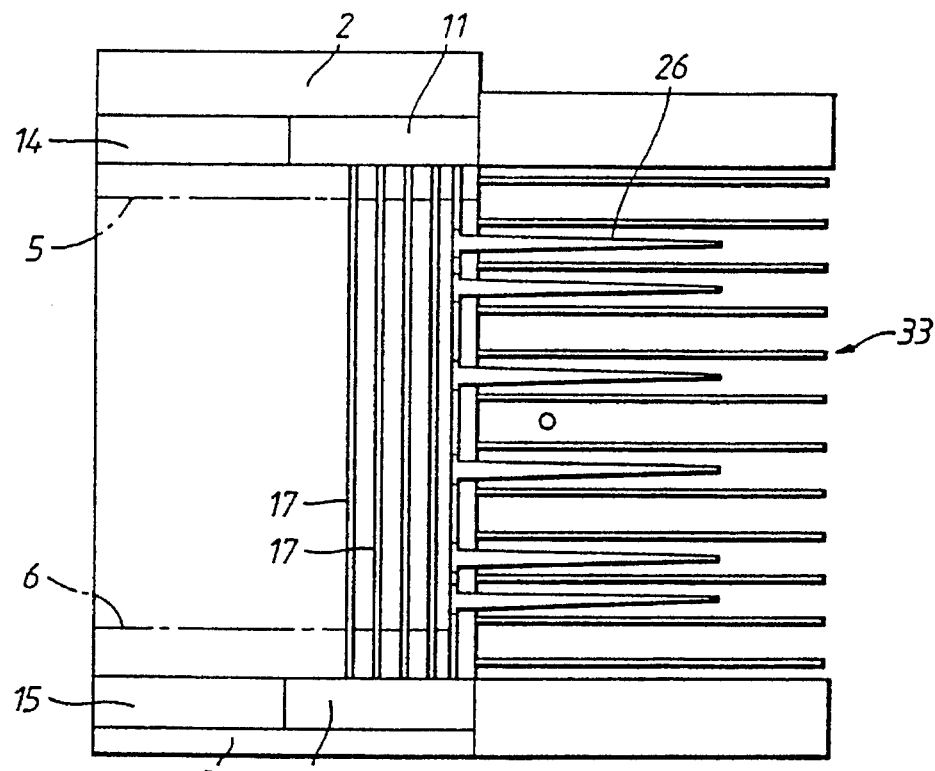
FIG. 1 is a plan view of the system.

The core of the system shown in the drawings comprises an accumulator which has some similarities with the accumulators already known for the purpose of accumulating printed circuit boards during the course of manufacture referred to above. The system comprises a stand 1 carrying a pair of housings 2 and 3 which contain bearings and drive means for a conveyor assembly 4. The conveyor assembly comprises a conveyor band of special construction to be described and a pair of rows of sprockets. The sprockets of each row are in tandem array on lines 5,6 respectively, the axes of rotation of the sprockets extending perpendicular to the lines 5,6. The rows include sprockets at the front (right-hand) end mounted on a drive shaft 7 common to the two and idler sprockets at the rear (left-hand) end mounted on stub shafts 8 extending towards one another from the housings 2,3 and extending only as far as the respective sprockets to leave a space between the idler sprockets. Between the sprockets at the front and rear ends there are several support sprockets on stub shafts 9 parallel with those of the main sprockets and with the upper surfaces of the main and support surfaces all lying in the same horizontal plane.

Lying alongside and outwardly of each of the rows of sprockets is a guide 11,12 in the form of a generally U-shaped loop providing an inwardly facing open groove or channel 12. The guide 12 is shown to a larger scale in FIG. 5. At the outer end of the upper run of each of the guides the upper and outer walls are cut away to provide a loading/unloading platform 14 while an equivalent cutaway on the lower run provides an unloading/loading platform 15, the purposes of these platforms being described below.

The band of the conveyor is made up of discrete lengths, sections, or units, a sufficient number of which could hypothetically be arranged end to end to form a complete loop in the nature of the conveyor band of a normal chain conveyor and initially, for convenience, will be so described. Thus the band comprises a pair of roller chains 16 which cooperate with the rows of sprockets described above and a plurality of parallel conveyor holders or slats 17 which are of the constant cross section shown in FIGS. 3 and 4 and thus comprise a base or bight 18 which is secured to links from the two chains and to limbs 19,21 with outwardly flared outer portions 22,23 to provide a mouth 24 leading to a slot 19 to receive a plurality of spaced support fingers 26, in this case six. Each finger 26 comprises a stub portion 27 which is a push-fit into the mouth 24 of the slat, an elongated blade 30 stiffened on its rear side by two webs 28 and a short forward wall 29 which diverges slightly from the blade and, with the lower part of the blade, forms a groove or slot 31 to receive the lower edge of a lamella 32 which is to be conveyed by the system.

It will be understood that if the conveyor band was continuous the system would operate as follows. As the leading board is advanced by a feed conveyor 33 it will enter the mouths 31 of the fingers 26 mounted in that slat 17 which is facing horizontally at the time. At this moment the conveyor band is stationary. A sensor detects the entry of a board into the slot and causes the conveyor band to index forward one pitch so that the next succeeding slat reaches the horizontal position at which time the conveyor band again stops. The next board is now able to enter the slots of the fingers of the next succeeding slat while the previous board will have been elevated into a position in which it is above the feed conveyor 33 and inclined upwardly from its lower edge as diagrammatically indicated in FIG. 2. Boards continue to be entered into the slots of the fingers on succeeding slats and on each movement of the conveyor they are inclined more and more steeply to the horizontal until they reach the horizontal pass of the conveyor band when they are held in approximately vertical planes.

In accordance with the invention, the conveyor band does not form a continuous loop but comprises a number of removable lengths, one end of one of which is shown in FIGS. 3 and 4. As can be seen in FIG. 4, the ends of the slats have outwardly extending projections 35 which are dimensioned to slide in the grooves 13 of the guides. Thus a single unit making up part of the conveyor band might consist of between 20 and 100 slats connected together by chain links.

Figure 2:
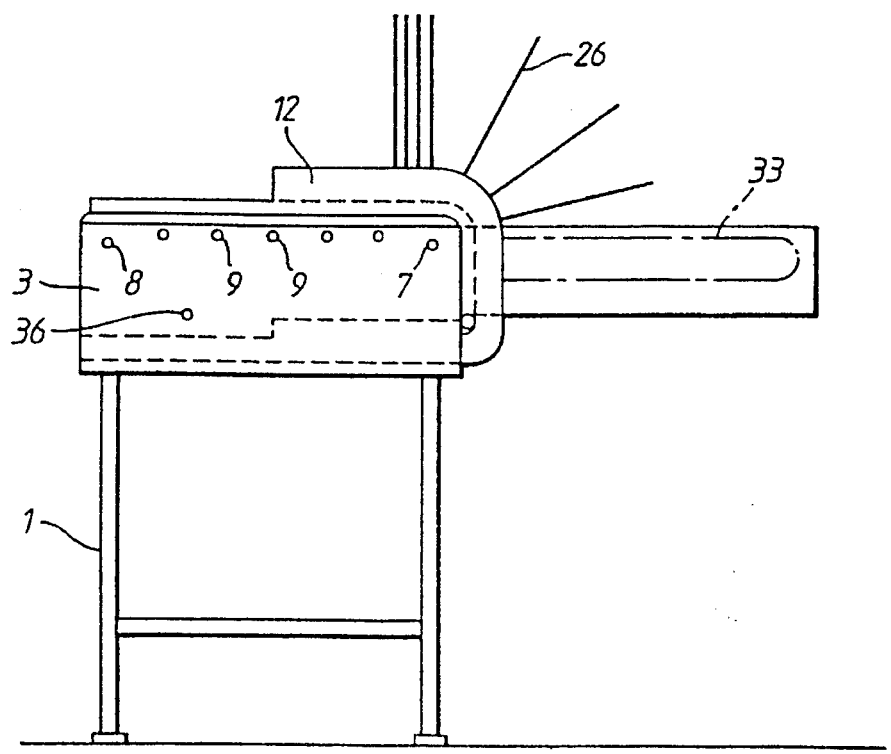
FIG. 2 is a side elevation of the system.

In use of the system for unloading the feed conveyor 33, a unit or length is inverted, i.e. with the fingers 26 pointing downwards, and is passed underneath the line of the conveyor from the left-hand side as seen in FIG. 1 and the projections 35 of the slats are laid on the loading portion 15 of the guide as seen in FIG. 4. As the unit is fed into this position the chain links are engaged by further drive sprockets on an axle 36 rotation of which will feed the unit around the guides. As the first slat reaches the upper end of the vertical limbs of the guides 11,12 (at the top right-hand corner of the device as seen in FIG. 2) it will receive a board from the feed conveyor 33 as described above. At this time, the leading chain links of the unit will be in engagement with the drive sprockets on the axle 7. Continued movement of the unit will cause each of the slats in turn to reach the board-receiving position and when the unit is full further movement will cause it to reach the unloading platform 14 at the top of the loop. The unit with the boards carried thereon can then be lifted clear, either by hand or by means of a lift truck having forks which can be introduced between the idler sprockets on the stub shafts 8. Alternatively, a track having a support surface at the same level as the platform 14 can be butted up against the left-hand end of the stand 1 as seen in FIG. 2 and the unit slid from the platform 14 across onto the support surface.

In the operation described, the system is being used to transfer boards delivered one by one by the conveyor 33 to a rack, the filled rack being removed from the machine. By reversing the operations the system may be used to remove boards one by one onto the conveyor 33; this is achieved by placing a full unit on the platform 14 and driving the sprockets so that the boards are delivered one by one to the conveyor 33 the empty unit being transferred to the lower platform from which it may be removed.

The operation has been described for a single unit but it will be realised that as soon as a unit has cleared the platform 15 (or the platform 14) a further unit may be placed on the vacated platform and successive units will then proceed through the machine in the manner of a train. Each unit may have, at one or at both ends, a spacer to engage an adjacent unit so that the spacing between the last slat in one unit and the first slat of the following unit will be the same as the spacing between adjacent slats within a unit.

Various modifications to the structure described are possible. Thus, the guides hay be arranged differently; for example, loading and unloading may take place at the bottom corner of the vertical limb rather than at the top. Automatic or mechanical means may be provided for loading and unloading the units; means may be provided for returning inverted units to the non-inverted condition or vice versa. Support fingers may be unnecessary for some applications although fingers or alternative supports are desirable for handling thin lamellae lacking substantial rigidity. Although two sets of drive sprockets have been described, only one set may be necessary or another means of inducing movement of the units through the machine may be employed. The loaded units are supported by support sprockets on the axles 9 along the upper run but the guides 11,12 may provide adequate support; alternatively rails on which the slats run may be satisfactory.

In a further modification, the slats 17 are replaced by blocks between which the edges of the lamellae are received as the unit passes around a curve and the blocks are fanned out and are trapped as the unit straightens out and the blocks assume a side-by-side relationship with the facing surfaces of each pair of adjacent blocks parallel to one another and gripping a lamella between them.

In another application of the invention, the upper run of the system is much longer than is the case with the example shown in the drawings so that the lamellae can be conveyed through, for example, one or more processing facilities such as an oven. Where the system includes a tunnel oven, the first and last slats of a unit may carry baffles having an outline closely similar to the interval cross-section of the tunnel to provide a substantial degree of sealing as described in greater detail in our Application No. PCT/GB91/02013.

Although reference has been made to each slat receiving a single lamella it will be appreciated that each slat could accommodate two or more smaller lamellae arranged edge to edge across the width of the machine.

The invention thus envisages a conveyor rack or unit which may be likened to a roller shutter in its flexibility in one direction and rigidity in another. In use, all or part of the unit can, in one condition, be flexed into a curve so that lamellae carried by the unit will be spread out like the paddles of a water wheel while in another condition the unit can be flexed to a lesser curve or to a flat state so that the lamellae will be generally parallel to one another. In the latter condition, loaded units can conveniently be brought to or removed from the handling system.

The rack or unit may carry chain links so that it may cooperate with a sprocket which may, as desired, provide support, drive and guidance; the unit may be caused to change direction around the sprocket to provide the non-linear path.

The handling system may include a pair of parallel guides with which the rack or unit cooperates to guide the rack or unit along its path. For example, the rack or unit may have lateral projections engaging in grooves in the guides. The rack or unit may include slats for supporting the lamellae and the projections may be constituted by the end of the slats or may be constituted by elements separate from the slats and carried by the chain links.

In one possible arrangement, the system includes one or more stationary guides for the rack and pusher means, such as a pneumatic or hydraulic cylinder, for pushing the rack along the guide or guides.

The rack or unit may carry a plurality of elongate support means, for example fingers, to support lamellae, particularly flexible or flimsy lamellae. Where the unit includes slats, the fingers may be mounted on the slats.

I claim:

1. A system for handling lamellae to be arranged generally vertically in a parallel array, comprising:
    a pair of parallel guides defining a non-linear path of predetermined length and forming a loading station and an unloading station spaced along said path from said loading station;
    an individual rack of predetermined length less than the length of said path, said rack including a support structure including rigid links and pivot means for interconnecting said links defining a plurality of parallel transverse axes of flexure, said rack being extendable such that said axes define a plane with said support structure being bendable in a first direction out of the plane but being unbendable in an opposite direction out of the plane, said rack also including supporting means for supporting at least the lower edges of the lamellae extending upwardly from the support, said rack having engagement means for cooperating with said guides to guide said rack along said guides, said engagement means being engageable with said guides at said loading station and dis-engageable from said guides at said unloading station, said rack being readily removable from and re-engageable with said guides; and
    advancing means for moving said rack along said non-linear path from said loading station to said, unloading station.

2. A system according to claim 1 in which said advancing means includes a sprocket and a chain with links that cooperate with said sprocket to transport said rack, and in which said rack engages said chain links.

3. A system according to claim 2 in which said rack flexes in said second direction to change a direction of travel and be transported around said sprocket along said non-linear path.

4. A system according to claim 3 which includes a pair of parallel guides with which the rack cooperates to guide the rack along its path.

5. A system according to claim 4 in which each of said pair of parallel guides has a groove, and said rack has lateral projections engaging said grooves in said guides.

6. A system according to claim 5 in which the rack includes a number of slats, which support the lamellae, and in which said lateral projections are constituted by opposing ends of the slats.

7. A system according to claim 6 in which the rack carries a plurality of elongated supports to support lamellae.

8. A system for handling lamellae in a spaced but face-to-face arrangement,
    a substantially flat rack of predetermined length, the rack having means on one side for supporting lamellae edge-on to the rack, said rack including a support structure including rigid links and pivot means for interconnecting said links defining a plurality of parallel transverse axes of flexure, said rack being extendable such that said axes define a plane with said support structure being bendable in a first direction out of the plane but being unbendable in an opposite direction out of the plane;
    means for guiding the rack along a path in one part of which the rack is flexed with a curvature greater than in another part of the path, said means including at least one section from which said flat rack can be removed; and
    advancing means for transporting said rack along said path, said path having a length that is greater than said pre-determined length of said rack, said rack being adapted to be readily removable from said advancing means and to be transported along the entirety of said path by said advancing means.

9. A system according to claim 8 in which said rack is flat when in said another part of the path.

10. A system according to claim 9 in which the rack is flexible in one direction only from a flat condition.

11. A system according to claim 8 which includes a plurality of substantially identical racks arranged for travel along the path in abutting relationship, each of said plurality of substantially identical racks abutting adjacent ones of said plurality of substantially identical racks in uncoupled engagement.

12. A system according to claim 1 which includes a pair of parallel guides with which the rack cooperates to guide the rack along its path.

13. A system according to claim 12 in which each of said pair of parallel guides has a groove, and said rack has lateral projections engaging said grooves in said guides.

14. A system according to claim 13 in which the rack includes a number of slats, which support the lamellae, and in which said lateral projections are constituted by opposing ends of the slats.

15. A system according to claim 1 in which the rack carries a plurality of elongated supports to support lamellae.

16. A system according to claim 4 in which the rack carries a plurality of elongated supports to support lamellae.

17. A system according to claim 8 in which the rack is flexible in one direction only from a flat condition.

18. A system according to claim 2 which includes a pair of parallel guides with which the rack cooperates to guide the rack along its path.

19. A system according to claim 1 which includes a plurality of substantially identical racks arranged for travel along the path in abutting relationship, each of said plurality of substantially identical racks abutting adjacent ones of said plurality of substantially identical racks in uncoupled engagement.

20. A system according to claim 7 which includes a plurality of substantially identical racks arranged for travel along the path in abutting relationship, each of said plurality of substantially identical racks abutting adjacent ones of said plurality of substantially identical racks in uncoupled engagement.

21. A system for handling lamellae to be arranged generally vertically in a parallel array, comprising:

a pair of parallel U-shaped guides having open end sections and defining a non-linear path of predetermined length, said guides forming a loading station and also forming an unloading station spaced along said path from said loading station;

an individual rack of predetermined length less than the length of said path, said rack including a support structure comprising rigid links and pivot means for interconnecting said links such that said support structure is rigid and unbendable beyond a predetermined shape in one direction and is flexible and bendable in a second direction opposite the first direction, and which also includes supporting means for supporting at least the lower edges of the lamellae extending upwardly from the support, said rack having engagement means for cooperating with said guides to guide said rack along said guides, said engagement means being engageable with said guides at said loading station and dis-engageable from said guides at said unloading station, whereby said rack is readily removable from and re-engageable with said guides; and advancing means for moving said rack along said non-linear path from said loading station to said unloading station.

22. A system for handling lamellae in a spaced but face-to-face arrangement, comprising:

a substantially flat rack of predetermined length, which is flexible and bendable in one direction and which is rigid and unbendable beyond a predetermined shape in a second direction that is opposite said first direction, the rack having means on one side for supporting lamellae edge-on to the rack;

U-shaped means for guiding the rack along a path in one part of which the rack is flexed with a curvature greater than in another part of the path, said means including at least one open end section from which said flat rack can be removed; and advancing means for transporting said rack along said path, said path having a length that is greater than said predetermined length of said rack, said rack being readily removable from said advancing means and being transportable along the entirety of said path by driving contact with said advancing means.

* * * * *

UNITED STATES PATENT AND TRADEMARK OFFICE
CERTIFICATE OF CORRECTION

PATENT NO. : 5,464,090
DATED : November 7, 1995
INVENTOR(S) : Alan W. Lucas

It is certified that error appears in the above-indentified patent and that said Letters Patent is hereby corrected as shown below:

```
Column 2, lines 6-10; Delete "The rack or...the non-linear path."
Column 2, lines 11-19; Delete  "The handling system...the chain links."
Column 2, lines 20-23; Delete "In one possible...the guide or guides."
Column 2, lines 24-27; Delete "The rack or unit...mounted on the slats."
Column 4, line 44; "hay" should be --may--
Column 6, line 4; After "said" delete ",".
Column 6, line 26; After "arrangement," insert --comprising:--.
```

Signed and Sealed this

Twenty-eighth Day of May, 1996

Attest:

BRUCE LEHMAN

Attesting Officer      Commissioner of Patents and Trademarks